United States Patent [19]

Petermann et al.

[11] Patent Number: 4,783,279

[45] Date of Patent: Nov. 8, 1988

[54] PLASTIC MIXTURE WITH ELECTROMAGNETIC SHIELDING CHARACTERISTICS

[75] Inventors: Hans J. Petermann; Klaus Wenderoth, both of Buxtehude; Wolfram H. O. Krieger, Hamburg, all of Fed. Rep. of Germany

[73] Assignee: Lehmann & Voss & Co., Hamburg, Fed. Rep. of Germany

[21] Appl. No.: 81,232

[22] Filed: Aug. 4, 1987

[30] Foreign Application Priority Data

Aug. 5, 1986 [DE] Fed. Rep. of Germany ....... 3626460

[51] Int. Cl.$^4$ .......................... H01B 1/06; C09D 5/32
[52] U.S. Cl. ..................................... 252/511; 252/135; 252/503; 252/506; 252/507; 252/510; 252/518; 252/520; 523/137; 524/495; 524/496; 524/440; 524/156; 524/213; 524/107; 524/412; 524/420; 524/413; 524/436
[58] Field of Search ............... 523/137, 440, 442, 456, 523/458, 457, 461, 468; 252/511, 513, 503, 506, 507, 510, 518, 520; 524/495, 496, 155–157, 440, 107–109, 410, 412, 420, 413, 436

[56] References Cited

U.S. PATENT DOCUMENTS 4,159,364  6/1979  Craig ................................. 428/334
4,493,912  1/1985  Duageon et al. ................... 523/137

*Primary Examiner*—Josephine Barr
*Attorney, Agent, or Firm*—Eric P. Schellin

[57] ABSTRACT

The invention relates to a plastic mixture with electromagnetic shielding characteristics based on a matrix with a content of ferroelectrics and electrically conductive and/or ferromagnetic fillers, which is characterized in that the ferroelectric component has a Curie point or a phase transition range from the ferroelectric into the paraelectric phase covering the Curie point and which is in the range of the use temperature of −40° to +98° C. of the electromagnetic shielding material and, based on the electromagnetic material volume, is present in a quantity of 1 to 20 vol. %, whilst the electrically conductive or ferromagnetic fillers are present in quantitites of 5 to 15 vol. %, the ferroelectric component preferably being an organic compound selected from the group consisting of semicarbazide-hydrochloride, 3,4-dihydroxy-3-cyclobutene-1,2-dione and triglycine sulphate and the inorganic compound is from the group consisting of barium-strontium titanate and antimony iodide sulphide.

4 Claims, No Drawings

PLASTIC MIXTURE WITH ELECTROMAGNETIC SHIELDING CHARACTERISTICS

FIELD OF THE INVENTION

The invention relates to a plastic mixture with electromagnetic shielding characteristics based on a plastic matrix with a content of ferroelectrics and electrically conductive and/or ferromagnetic fillers.

The present invention relates generally to electroconductive molding composition and the like which are expecially useful in fabricating shielding for sophisticated electronic equipment, power tools, automotive ignition systems, household appliances like microwave or for that matter, any component(s) or equipment which produces stray electromagnetic emission and have the potential of damaging or adversely affecting the performance of other equipment or components. More particularly, the immediate invention relates to electrically conductive bulk, granular, sheet, coating or nodular molding compositions comprising a multi-component filler system having at least two synergistically acting members, the combination providing a spectrum of shielding to electromagnetic interference (EMI) which said individual fillers are unable to achieve without substantial reduction in mechanical properties and/or processing characteristics.

BACKGROUND OF THE INVENTION

Heretofore, various methods have been used to shield electronic equipment. Metallic boxes and cans fabricated from steel, copper, aluminum, etc., were used by surrounding high EMI emitters for shielding. However, because shields fabricated from metal were cumbersome, heavy and costly the electronics industry has resorted to metallized plating on plastics. But, the results obtained with metallic coatings were not always satisfactory. In addition to being relatively non-economic, once such metallic coatings were scratched through they would lose part of their shielding efficiency. Unless such conductive coatings are continuous and free of voids, electromagnetic waves will be free to pass through. Frequently, it was difficult to obtain a dependable, 100% effective coating which was also resistant to peeling.

Further efforts by the electronics industry to develop more dependable light-weight materials for EMI shielding has led to a third approach, namely electrically conductive composites consisting of a variety of polymers loaded with conductive fillers and/or reinforcements. It was anticipated that intricate shapes could be moded from the composite materials by a conventional means, yielding a finished part that promised to be more economic and dependable than metal or metal-coated plastics.

One of the most common conductive fillers used in the composite approach has been carbon black. The major advantage of resinous composites containing this filler has been that it flows readily in molding processes, and therefore, provides a high degree of design flexibility. However, in order to obtain nominally acceptable shielding efficiencies to EMI emissions loadings of carbon black in molding compounds should be above 15% by weight. A similar requirement also exists in the case of graphite powder. In each instance, the loading levels required of powdered and spherical-shaped conductive fillers has been too high to achieve acceptable conductivity without reducing the impact resistance and other mechanical properties needed for EMI shields and housings. Carbon/graphite fibers also provide acceptable EMI shielding efficiencies, but because of very high cost they are not viewed as acceptable alternatives to the more economic powders and nodules.

Metal particles of various sizes and shapes such as aluminum, copper, nickel, zinc, etc., have also been used in molding compositions as conductive fillers. The principle factor influencing the performance of metal-filled composites is the aspect ratio of the particles. For example, spherical-shaped particles must be loaded to a 38% by volume concentration to achieve electrical conductivity. However, this frequently leads to poor mechanical properties and poor cost effectiveness. In contrast, fibrous metal particles are able to impart electrical conductivity to composites with as little as 7% by-volume metal. However, high aspect ratio fibers are difficult to process in that they become entangled and agglomerate producing a poorly dispersed mixture.

EU-A No. 1 0043 040 discloses composite materials for shielding against electromagnetic radiation containing in a polymer matrix metallized textile fabrics, filaments or metallized particles. The matrix material is a polymer plastic, such as e.g. a plasticized polyvinyl chloride. However, it is difficult to incorporate into a plastic matrix metallized fabrics and it is not possible to process the same in conventional manner by extrusion or injection molding when in granular form. It is difficult to distribute metallized filaments into a plastic matrix in the case of extrusion or injection molding, so that "windows" transparent to electromagnetic radiation are formed. Apart form the electrically conductive component, these materials also contain additives for increasing the electrical and/or magnetic conductivity, such as carbon black, graphite or ferrites. In the case of materials containing metallized filaments, they only have a limited shielding action and is in a range of 38 to 29 dB in the case of a frequency range of 50 MHz to 35 GHz.

DE-OS No. 35 18 335 also discloses an electromagnetic shielding material, which contains an electrically conductive carbon powder and a Mn-Zn-ferrite powder in a high molecular weight, organic matrix, such as rubber, thermoplastic or synthetic resin. However, the shielding capacity of this material only extends up to 45dB in the case of a standard frequency of 1000 MHz. In addition, the necessary ferrite filling quantities of 30 to 70 vol. % are so large, that the mechanical characteristics of the plastic materials are impaired.

Finally, EU-A No. 20 0 90 432 discloses an electromagnetic shielding material, in which short metal filaments with high electrical conductivity and a ferromagnetic component are present in a plastic matrix. The conductive metal filaments can be made form precious metals, copper, aluminium, zinc, nickel, iron and the alloys thereof, whilst the ferromagnetic material comprises ferrites, iron, cobalt and nickel. Apart from carbon black, a ferroelectric component can be present, such as barium titanate, lead titanate, lead niobate and lead zirconate. However, these shielding materials also suffer form the disadvantage of being difficult to process as a result of the metal filaments. The shielding action is also inadequate, being in the range 10 to 20 dB at 8 to 13 GHz.

The problem of the present invention is therefore to disclose an electromagnetic shielding material, which can easily be processed by conventional methods, particularly plastic extrusion and injection molding, whilst inhibiting "windows" which are transparent to electromagnetic waves and permitting an extremely good shielding action.

SUMMARY OF THE INVENTION

It has surprisingly been found that in the case of shielding materials according to the invention, which contain electrically conductive and/or ferromagnetic fillers, the nature of the ferroelectrics which are also present plays a considerable part. It has surprisingly been found that such ferroelectrics have a very good shielding action in electromagnetic shielding materials constructed in this way in the case of the basic standard frequencies of e.g. 30 MHz to 30 GHz, when said ferroelectrics have a Curie point which is in the range of the particular temperature of use of the shielding material. In place of the Curie point, the phase transition range from the ferroelectric into the paraelectric phase is to be equated with the Curie point and in fact covers the latter. The Curie point can firstly be defined as a specific temperature, at which the ferroelectric compound used as the ferroelectric is transformed form one phase into the other. However, secondly in place of the Curie point, it is also possible to use a temperature range as the phase transition range which includes the Curie point and covers the temperature range of transformation from the ferroelectric into the paraelectric phase.

According to the invention, the ferroelectrics with the invention Curie points or phase transition ranges at the temperature of use are to be present in the shielding material in a quantity of 1 to 20 vol %, whilst the conductive fillers are present in quantities of 5 to 15 vol %.

The reference quantity to the volume proportion of the ferroelectrics, based on the total volume of the electromagnetic shielding materials, is given preference, because the ferroelectrics corresponding to the invention requirements differ considerably from one another as regards their specific density. Thus, for example, the organic ferroelectrics used in preferred manner, such as semicarbazide-hydrochloride, squaric acid (defined as 3,4,-dihydroxy-3-cyclobutene-1,2-dione), and triglycine sulphate have a relatively low density of 1.58 or approximately 1.2 and 1.69 g/cm$^3$, whilst inorganic ferroelectrics such as barium-strontium titanate or antimony iodide sulphide, SbJS, have a relatively high specific weight of 6 to 8 g/cm$^3$.

Although the theoretical links have not been completely clarified, it can be assumed that the inventive ferroelectrics with a Curie point or a phase transition range in the range of the temperature of use give a particularly effective shielding action because the electromagnetic radiation striking the same at the operating or use temperature of the shielding material absorbs an excessively high energy proportion of the irradiating or emitting electromagnetic wave energy in the Curie temperature range.

The Curie temperatures $T_c$° C. of the inventively used ferroelectrics and the hitherto used ferroelectric compounds can be discerned from the following table.

TABLE I

| Ferroelectriccompound | $T_c$°C. |
| --- | --- |
| Semicarbazide-hydrochloride | 21° C. |
| Squaric Acid | 98° C. |
| Triglycine sulphate | 49° C. |
| Ba$_{0.8}$Sr$_{0.2}$TiO$_3$ | 70° C. |
| Ba$_{0.7}$Sr$_{0.3}$TiO$_3$ | approx. 20° C. |
| Barium titanate | 135° C. |
| Lead titanate | 490° C. |

TABLE I-continued

| Ferroelectriccompound | $T_c$°C. |
| --- | --- |
| Strontium titanate | −163° C. |
| Lead niobate | 570° C. |
| Lead zirconate | 230° C. |

The matrix can be formed from conventional casting resins, thermoplastics, thermosetting resins, elastomers or other carrier materials. The plastic matrixes can be in the form of a sheet or solid body, as well as a dispersion, e.g. for varnishes and lacquers.

The particle size of the individual components in the carrier material is mainly a function of the intended use and the processability. Generally the particle size of the electrically conductive or ferromagnetic fillers is in the range 1 to 800μm and preferably in the range 1 to 100 μm and is down to 30 nm in the case of carbon black. The ferroelectrics are preferably also present in finely divided form and have a particle size of e.g. 1 to 500μm and preferably 1 to 20μm.

DETAILED DESCRIPTION OF THE INVENTION

Example I

Electromagnetic shielding materials were produced with a polypropylene matrix containing as the electrically conductive and ferromagnetic filler nickel in a particle size of 2.5μm and additionally containing as ferroelectrics semicarbazide-hydrochloride or triglycine sulphate or barium-strontium titanate of formula Ba$_{0.8}$Sr$_{0.2}$TiO$_3$. Shielding measurements were made using a modified test arrangement according to Prof. ter Haseborg (R.M. Simon "High accuracy in EMI measurement", Mod. Pl. Int. 9, 124 (1983)), in which samples of the plastic mixtures with a diameter of 10 cm and a thickness of 0.3 cm were placed in a measuring chamber between the transmitter and the receiver (antennas). The measurements were performed at frequencies of 1 MHz to 1 GHz.

The shielding was determined in dB as a function of the frequency on a system constituted by polypropylene and nickel with rising quantities of 0, 5, 10, 15 and 20 vol % nickel. In a further test, the system polypropylene and 10 vol % nickel was measured with an addition of 5 vol % of semicarbazide-hydrochloride (SHCl) and 10% semicarbazide-hydrochloride or 10 vol % triglycine sulphate (TgS), the following values having been obtained at a standard frequency of 500 MHz according to Table II:

TABLE II

| | Shielding in dB at 500 MHz at | | | | |
| --- | --- | --- | --- | --- | --- |
| | 0% Ni | 5% Ni | 10% Ni | 15% Ni | 20% Ni |
| without ferroelectrics | — | 5 | 23 | 75 | 75 |
| +5 Vol. % SHCl | — | — | 75 | — | — |
| +10 Vol. % SHCl | 12 | — | 75 | — | — |
| +10 Vol. % TgS | — | — | 55 | — | — |
| +10 Vol. % Ba$_{0.8}$Sr$_{0.2}$TiO$_3$ | — | — | 35 | — | — |

The above values show that through the addition of only 5 to 10 vol. % of semicarbazide-hydrochloride, the same shielding values are obtained as for a much higher Ni-addition of 15 to 20 vol. %, which would make the processability of the plastic mixtures much more difficult and would also make them more expensive. These values also show that in the case of barium-strontium titanate, there is a good shielding of 35 dB at 500 MHz, but this was lower than that obtained with semicarbazide-hydrochloride. This is also understandable, because the Curie temperature and therefore the sharp rise in the dielectric constant of barium-strontium titanate of 70° C. as opposed to 21° C. for semicarbazide-hydrochloride is displaced towards higher operating higher operating temperatures.

Example 2

In accordance with example 1, plastic mixtures based on polypropylene were prepared, which contained in each case 10 vol. % Ni and the herein disclosed ferroelectrics in different concentrations.

The following table III shows polypropylene compositions made conductive with nickel and containing ferroelectrics with different Curie points. The shielding efficiency was measured at different temperatures of use $T_E$. In the case of triglycine sulphate and semicarbazide-hydrochloride, the shielding efficiency is at a maximum when the measuring temperature is close to the Curie temperature.

TABLE III

Shielding efficiency of PP mixtures at different measuring temperatures.

| Test | Composition in vol. % | $T_E$ °C. | Shielding efficiency at 1 Ghz dB | Currie point °C. |
|---|---|---|---|---|
| No. 1 | Triglycine sulphate | 28 | 37 | 49 |
| | 10% Ni + | 45 | 40 | |
| | 10% TgS | 90 | 25 | |
| | Sample 2 mm | | | |
| No. 2 | Semicarbazide-hydrochloride | 25 | 80 | |
| | 10% Ni + | 45 | 75 | 21 |
| | 5% SHCl | 90 | 47 | |
| No. 3 | Semicarbazide-hydrochloride | 25 | 75 | |
| | 10% Ni + | 45 | 30 | 21 |
| | 10% SHCl | 90 | 10 | |

TgS = Triglycine sulphate
SHCl = Semicarbazide-hydrochloride

The values of the above table clearly show that the novel chosen ferroelectrics at the corresponding use temperatures $T_E$ with their corresponding values in the Curie temperature range, gave the best values for the shielding efficiency and namely in test 1 with a Curie temperature of 49° C. at $T_E$ was 45° C. and in tests 2 and 3 with a Curie temperature of 21° C. at $T_E$ values of 25° C.

Comparative test

A metallized shielding material identical to that of EU-A No. 2 0090 432 was investigated with a ferromagnetic material, namely nickel with a particle size of 2.5 μm in a quantity of 10 vol. % and barium titanate as the ferroelectric in a quantity of 10 vol. %. The shielding results were scarcely better than those for a pure 10 vol. % Ni-filling and were only 23 dB, which can be explained by the fact that barium titanate has a Curie point of 135° C., whereas the barium-strontium titanate transition temperature is 70° C., i.e. is much better suited to the range of use of the shielding material.

In the case of the known use of pure lead titanate (10 vol. %) with Curie points of 490° C. and 10 vol. % nickel, very low shielding values of roughly 10 db were obtained, which were even lower than those when using 10 vol.% Ni alone.

What is claimed is:

1. A plastic composition having electromagnetic shielding properties comprising: a quantity of ferroelectric as a first material selected from the group consisting of semicarbazide-hydrochloride, 3,4-dihydroxy-3-cyclobutene-1,2-dione, triglycine sulphate, barium-strontium titanate and antimony iodide sulphide and a quantity of a second material of electrically conductive and ferromagnetic fillers selected from the group consisting of nickel, iron, cobalt, carbon black and carbon fibers, said first material has a Curie point or a phase transition range from the ferroelectric state into the paraelectric phase covering the Curie point which is in the range of the temperature of use of the said shielding of the electromagnetic shielding material of 40° to +98° C. said first material quantity is between 1 to 20 vol. percent of the total plastic composition and the said second material quantity is between 5 to 15 vol. percent, the remainder being a polymeric material.

2. The plastic mixture in accordance with claims 1, wherein the polymeric material is selected from the group consisting of thermoplastic materials, elastomers, thermosetting resins and casting resins.

3. The mixture of claim 1, wherein the particle size of the electrically conductive and ferromagnetic fillers range from about 1 to about 800 μm.

4. The mxiture of claim 1, wherein the electrically conductive and ferromagnetic filler is carbon black having a particle size range of from about 1 to about 500 μm.

* * * * *